Figure 1:
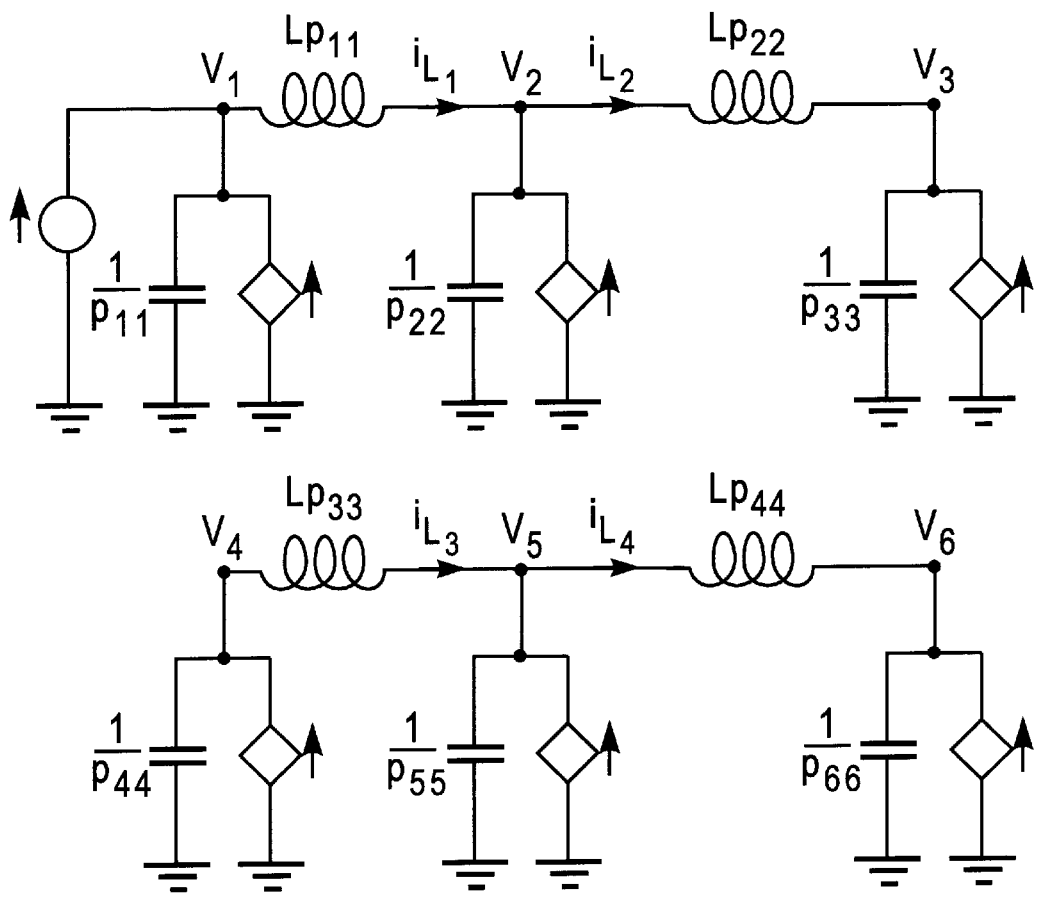

United States Patent [19]
Cullum et al.

[11] Patent Number: 6,058,258
[45] Date of Patent: May 2, 2000

[54] METHOD FOR ANALYZING THE STABILITY AND PASSIVITY OF SYSTEM MODELS

[75] Inventors: Jane Grace Kehoe Cullum, Yorktown Heights; Albert Emil Ruehli, Chappaqua, both of N.Y.

[73] Assignee: International Business Machines Corporation, Armonk, N.Y.

[21] Appl. No.: 08/959,208

[22] Filed: Oct. 28, 1997

[51] Int. Cl.[7] .............................. G06F 17/10; G06F 17/50
[52] U.S. Cl. ............................... 395/500.23; 395/500.34; 395/500.07
[58] Field of Search ..................... 364/468.04, 468.28; 395/500.02, 500.23, 500.05, 500.12, 500.19, 500.34, 500.35, 500.4, 500.07

[56] References Cited

U.S. PATENT DOCUMENTS

| | | | |
|---|---|---|---|
| 5,313,398 | 5/1994 | Rohrer et al. | 395/500.35 |
| 5,379,231 | 1/1995 | Pillage et al. | 395/500.35 |
| 5,408,638 | 4/1995 | Sagawa et al. | 395/500 |
| 5,537,329 | 7/1996 | Feldmann et al. | 364/489 |
| 5,689,685 | 11/1997 | Feldmann et al. | 395/500.23 |
| 5,826,215 | 10/1998 | Garrett et al. | 702/75 |

OTHER PUBLICATIONS

Ruehli et al., "Challenges and Advances in Electrical Interconnect Analysis," 29th ACM/IEEE Design Automation Conference, pp. 460–465, 1992.

Slone et al., "Using Partial Element Equivalent Circuit Fall Wave Analysis and Páde via Zavenges to Numerically Simulate EMC Problems", pp. 608–613, 1997.

Ruehli et al., "Stability of Discretized Partial Element Equivalent EFIE Circuit Models," IEEE Transactions on Antennas and Propagation, pp. 553–559, 1995.

Heeb et al., "Three Dimensional Circuit Orientend Electromagnetic Modeling for VLSI Interconnects", pp. 218–221, 1992.

Heeb et al., "Three–Dimensional Interconnect Analysis Usign PEECs," IEEE Trans. on Circuits and Systems, pp. 974–982, 1992.

Ruehli et al., "PEEC Method and Its Application in the Frequency and Time Domain," pp. 128–133, 1996.

Garrett et al., Stability Improvements of Integral Equation Models, pp. 1810–1813, 1997.

*Primary Examiner*—Paul R. Lintz
*Assistant Examiner*—Leigh Marie Garbowski
*Attorney, Agent, or Firm*—McGinn & Gibb, P.C.; Stephen C. Kaufman

[57] ABSTRACT

A method is provided for analyzing stability and passivity of physical systems. A physical system having time delays is represented as a linear circuit model. The linear circuit model is transformed into a corresponding transform domain circuit model. Sensitivity analysis is applied to the transform domain circuit model for generating information indicative of the stability or the passivity of the physical system having the time delays. A graphical representation may be created of the information indicative of the stability or passivity of the physical system having the time delays.

20 Claims, 8 Drawing Sheets

METHOD FOR ANALYZING THE STABILITY AND PASSIVITY OF SYSTEM MODELS

1 FIELD OF THE INVENTION

This invention relates to a novel method for analyzing the stability and passivity of models for various types of physical systems describable as linear circuit models with time delays.

2 INTRODUCTION TO THE INVENTION

Our motivation and methodology for the present invention are informed by an illustrative situation which centers on the design of three-dimensional models for VLSI interconnects. High density layouts and decreasing clock cycle times have amplified the effects of interconnect time delays and electromagnetic coupling in packaged electronic circuits, exasperating the possibilities for signal delays and distortion. Simulation software for analyzing the performance of the package requires realistic stable and passive models of the package. For very large sets of circuits, package models are generated by coupling models of well-chosen subsets of the overall set of circuits. To guarantee the stability of the coupled models, it is necessary that each of the individual models is stable and passive. Three-dimensional PEEC models for VLSI interconnects are formulated as linear circuit models with time delays.

3 SUMMARY OF THE INVENTION

With respect to the aforementioned package simulation models, it is necessary to generate coupled package models which are stable. This can be accomplished by ensuring that each of the models which are to be coupled, is stable and passive.

In high density layouts with very fast clock cycle times, models for VLSI interconnects must include the effects of the wire travel time and of the electromagnetic coupling between wires. Partial Element Equivalent Circuit (PEEC) models which are based upon integral formulations of Maxwell's equations and which are expressed as equivalent circuit formulations yield linear systems of ordinary differential equations with multiple time delays which occur in both state variables and derivatives of state variables. Tools are needed for the systematic study of the stability and passivity of these types of models.

We point out, by way of contrast and apposition, that the prior art has not adequately addressed this problem, and does not articulate a systematic method for studying the stability and the passivity of such models. That is, to an extent the prior art may somehow intersect with the situation outlined above, it must inherently respond to it by recourse to unsatisfactory ad hoc or heuristic expedients.

We have now discovered a novel method for systematically studying the stability and the passivity of PEEC models for VLSI interconnects. This method is equally applicable to other physical systems describable by time-invariant, linear systems of ordinary delay-differential equations. In this way, we advantageously solve the problem presented above, and fulfill an important need.

The method includes the steps of:
1. representing a physical system comprising time delays as a linear circuit model;
2. transforming the linear circuit model into a corresponding transform domain circuit model;
3. applying sensitivity analysis to the transform domain circuit model for generating information indicative of the stability or passivity of the physical system;
4. creating a graphical representation of the information indicative of the stability or the passivity of the physical system.

4 DETAILED DESCRIPTION OF THE DRAWINGS

Figure 2:
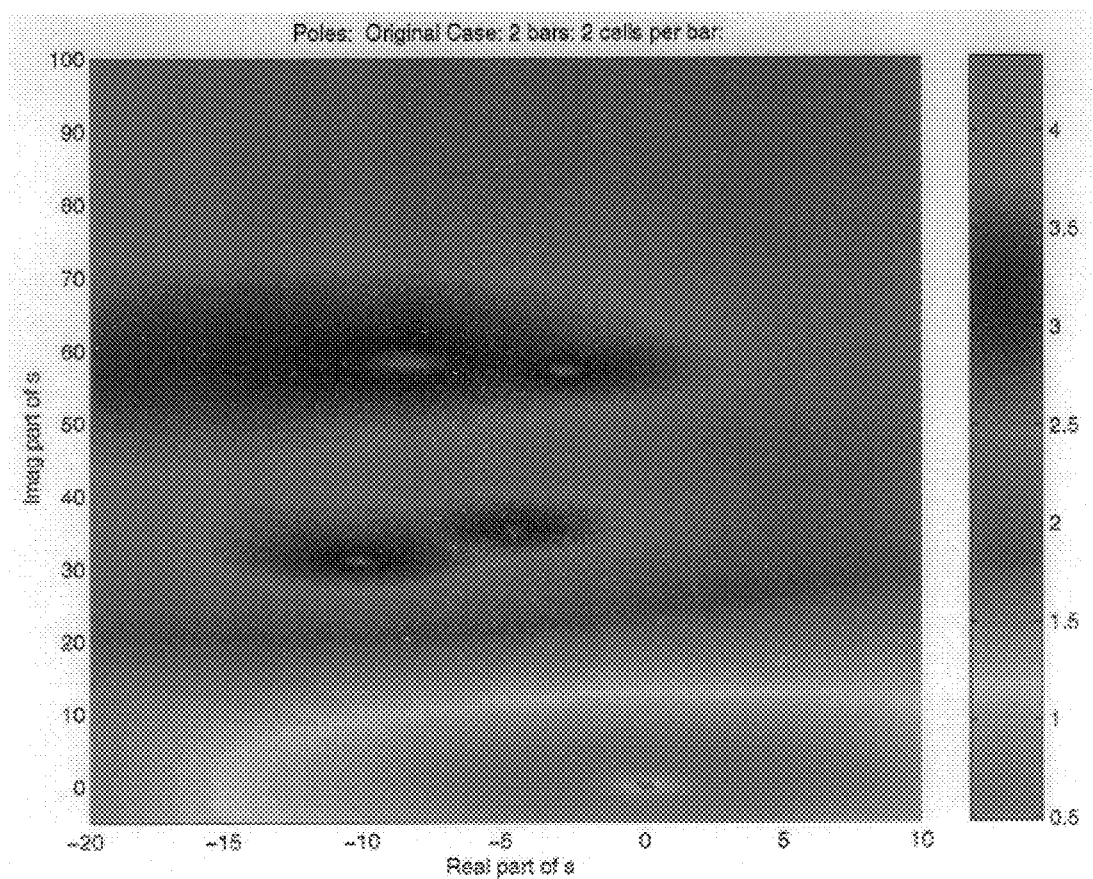
Figure 3:
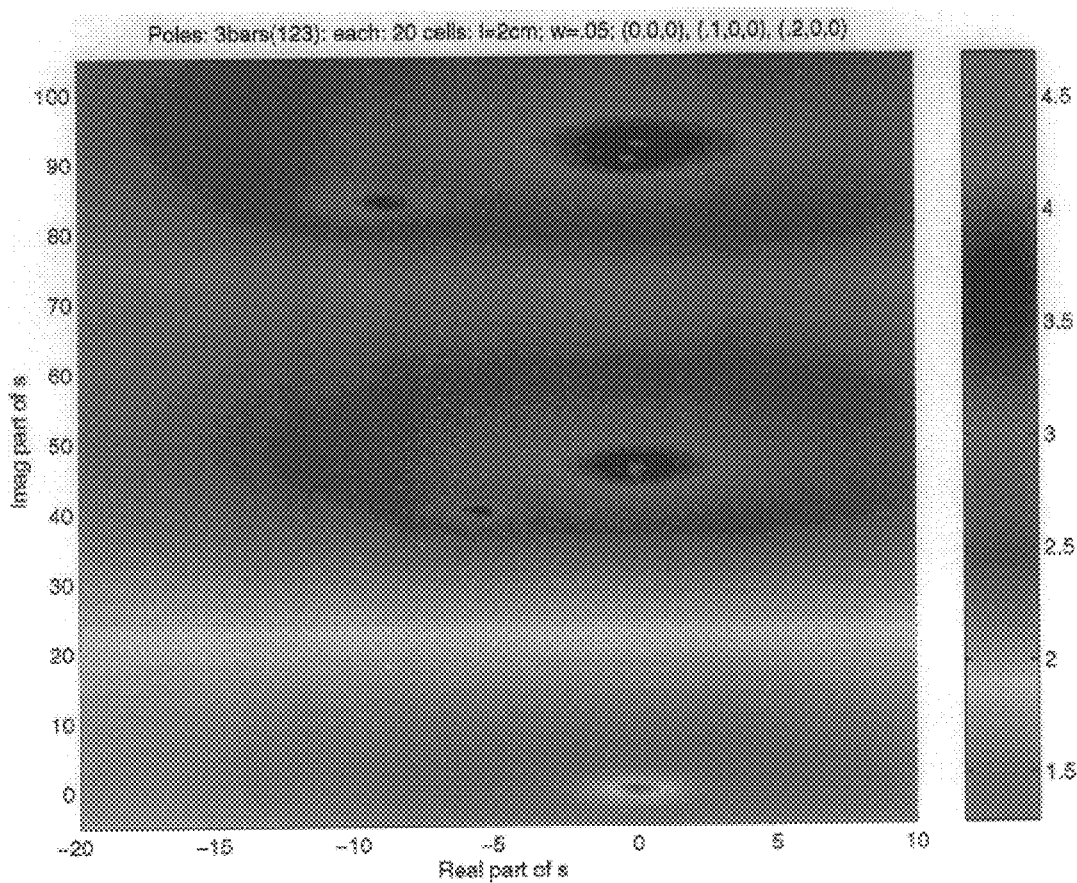
Figure 4:
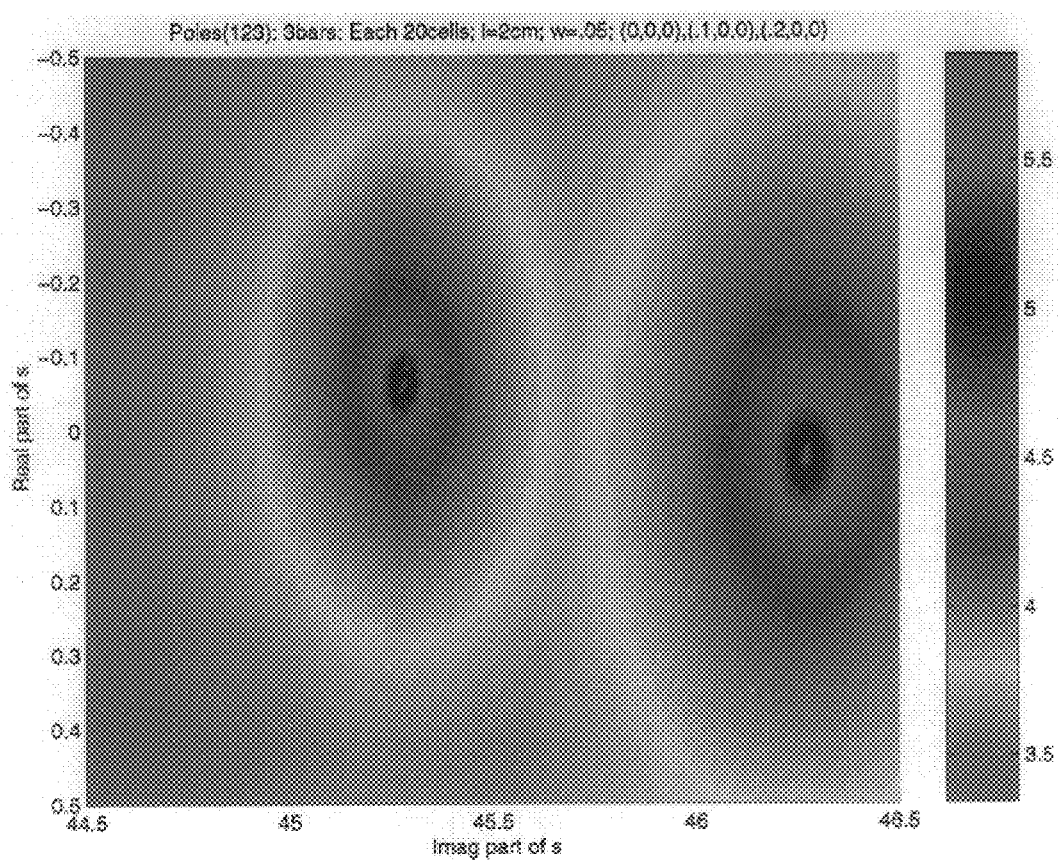
Figure 5:
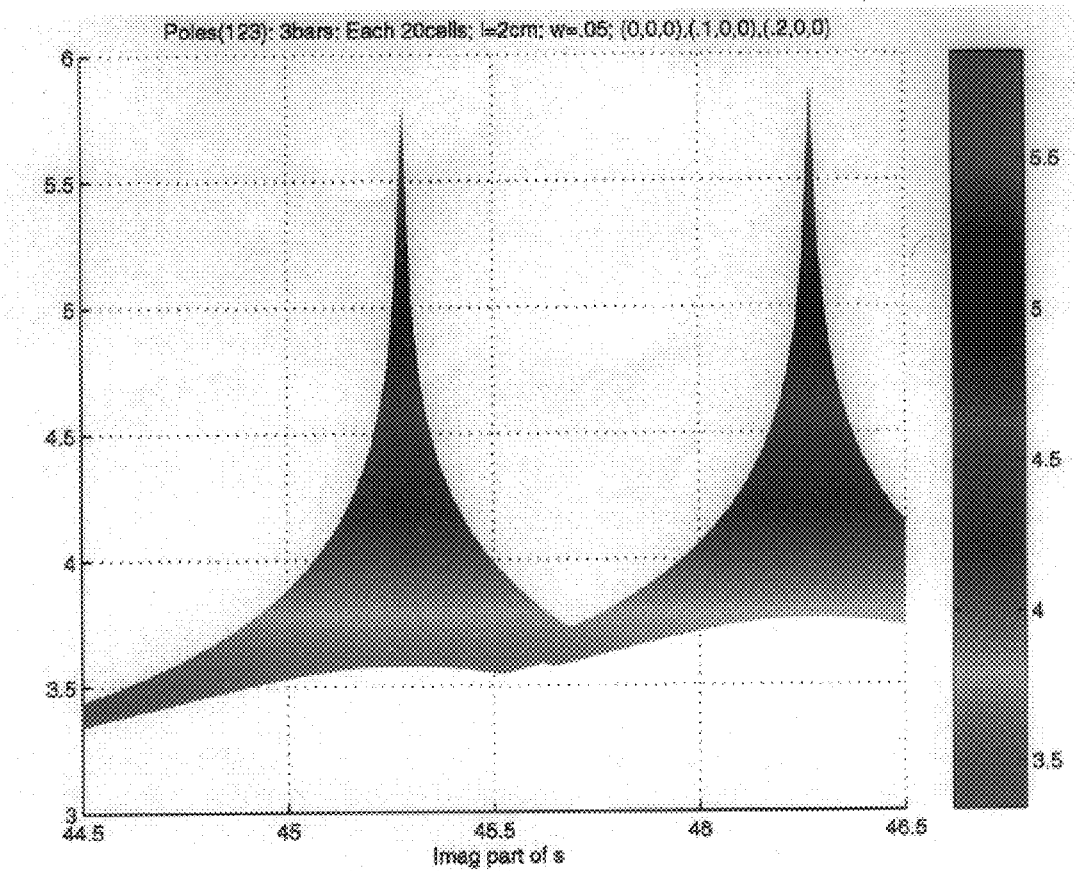
Figure 6:
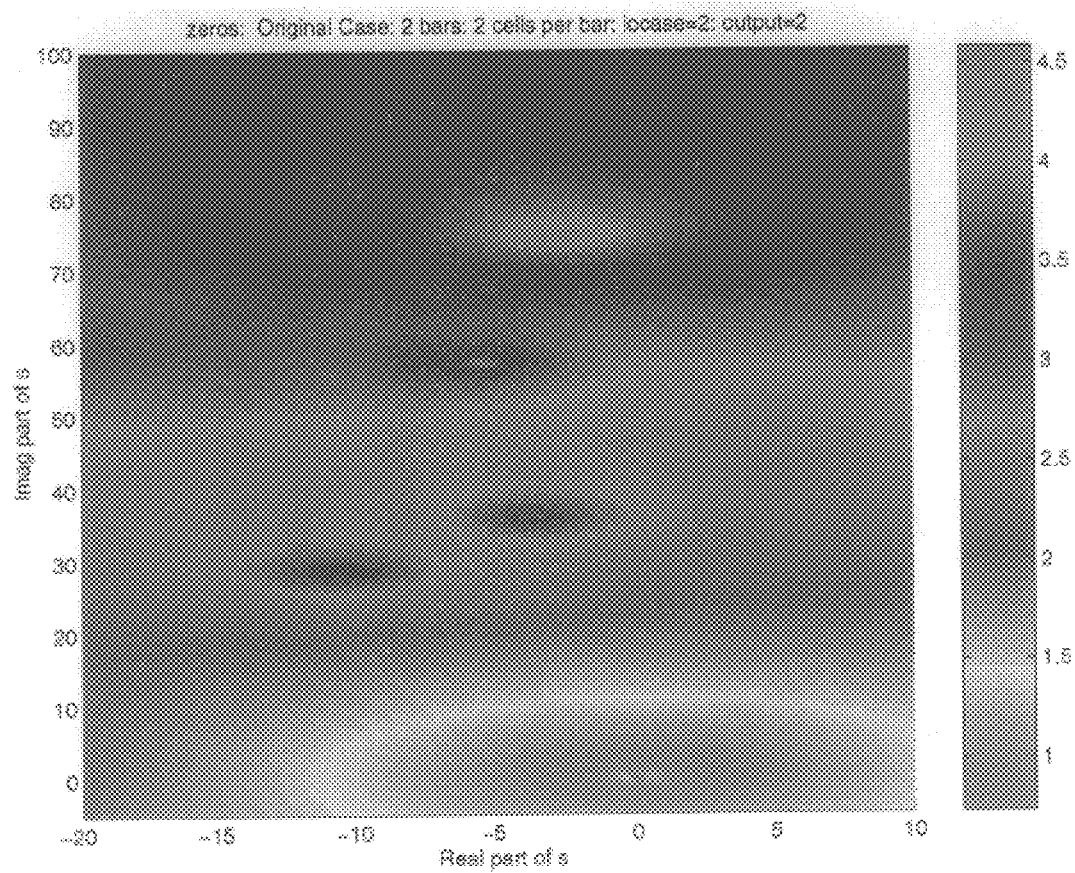
Figure 7:
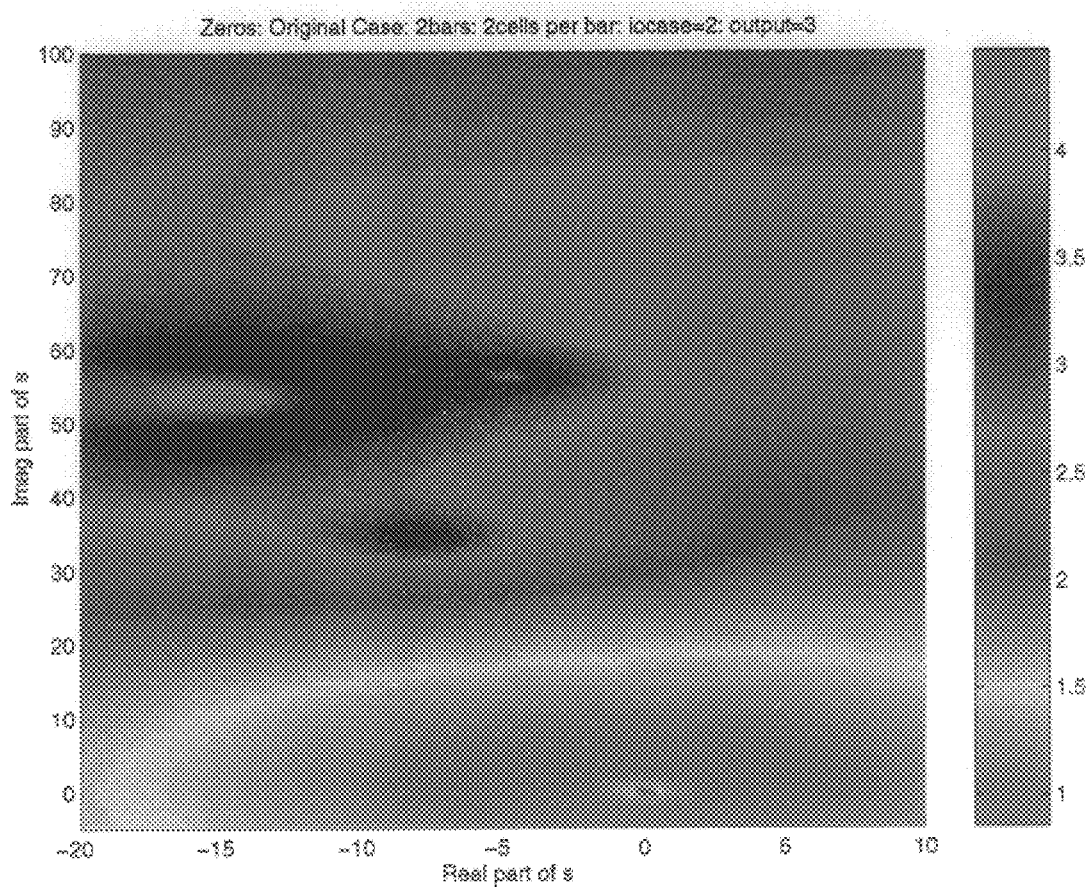
Figure 8:
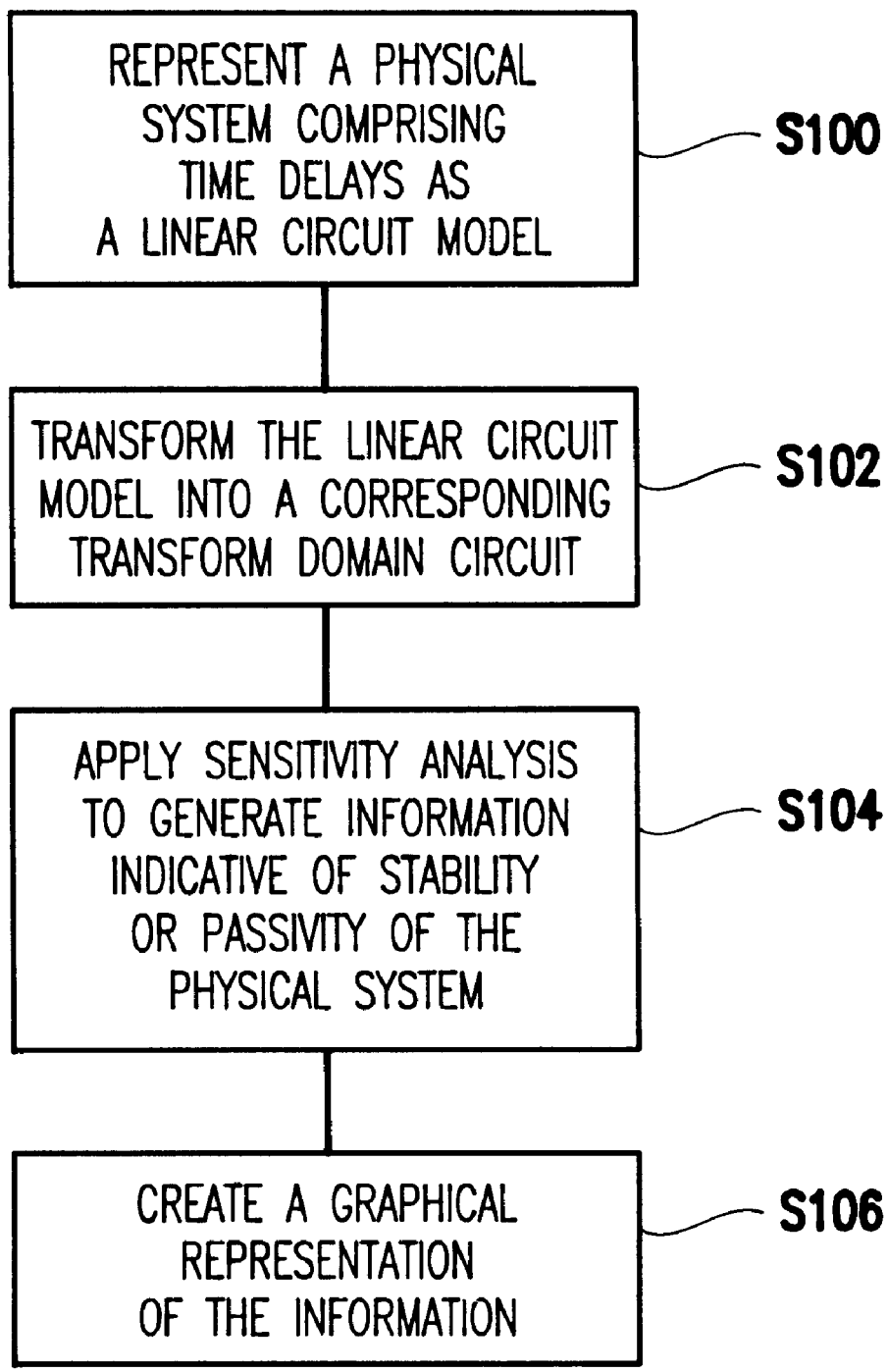

The invention is illustrated in the accompanying drawings, in which:

FIG. 1 is a circuit diagram for Example 1, a VLSI Interconnect PEEC circuit comprising two wires, two inductive cells in each wire;

FIG. 2 corresponds to pole approximations for Example 1 in the complex box $[-20, 10] \times [-5, 100]$;

FIG. 3 corresponds to pole approximations for Example 2, a larger PEEC model with three wires, twenty inductive cells in each wire, in the complex box $[-20, 10] \times [-5, 100]$;

FIG. 4 corresponds to a localization of pole approximations for Example 2, in the complex box $[-0.5, 0.5] \times [44.5, 46.5]$;

FIG. 5 corresponds to a localization of sensitive frequencies for Example 2, using a two dimensional projection of a three-dimensional plot of the sensitivity function in the complex box $[-0.5, 0.5] \times [44.5, 46.5]$;

FIG. 6 corresponds to zero approximations for Example 1 in the complex box $[-20, 10] \times [-5, 100]$, using the nodal voltage $V_2$ in FIG. 1 as the output variable;

FIG. 7 corresponds to zero approximations for Example 1 in the complex box $[-20, 10] \times [-5, 100]$, using the inductance current $I_{L_1}$ in FIG. 1 as the output variable;

FIG. 8 shows steps of a preferred method according to the present invention.

5 DETAILED DESCRIPTION OF THE INVENTION

The detailed description of the invention proceeds as follows. In section 5.1 we set forth the notation. In section 5.2 we review briefly PEEC formulations and give a schematic diagram and corresponding relationships for a simple PEEC example which is used in section 5.8 to illustrate the proposed method. To motivate the invention, in section 5.3 we consider systems described by ordinary differential equations with no time delays. We review relationships between system stability and passivity and the poles and the zeros of the associated frequency domain transfer functions, and relationships between pole and zero computations and linear eigenvalue problems.

In section 5.4 we extend the discussion in section 5.3 to problems describable by linear time invariant systems of delay-differential equations, expressing corresponding pole and zero computations as nonlinear transcendental eigenvalue problems or as changes in matrix rank. In section 5.5 we review briefly pseudospectral analysis for linear non-symmetric eigenvalue problems. In section 5.6 we define a nonlinear pseudospectral procedure for pole and zero characterizations for linear time invariant systems of delay-differential equations. The power of this approach is demonstrated in section 5.8 where we apply this procedure to pole and zero computations for two PEEC examples. Example 1 corresponds to FIG. 1 and Equations (7, 8), and Example 2 is a larger PEEC model for three wires and 20 cells per wire. We use the following notation and definitions.

5.1 Notation $A = (a_{ij})$, $1 \leq i, j \leq n$, n×n matrix $A(s)$=n×n matrix which is a function of parameter s $\lambda_j(A)$, $1 \leq j \leq n$, eigenvalues of A $\sigma_j(A)$, $1 \leq j \leq n$, $\{\sigma_1 \geq \ldots \geq \sigma_n\}$, singular values of A $\omega(A)$, spectrum of A $\|A\|_2 = \sigma_1(A)$, spectral norm of A $\text{dist}(s,\omega(A))$, distance of s from the spectrum of A n×n diagonal matrix of singular values of A $\kappa(A) = \sigma_{max}(A)/\sigma_{min}(A)$, condition number of A $\det(A(s))$, determinant of A(s), $$\|x\|_2 = \sqrt{\sum x_j^2}$$

$z_k$, kth vector in any sequence of vectors, s, point in complex plane

C, complex plane $I_j$, j×j identity matrix si/so, single input, single output system mi/mo, multiple input and/or multiple output system

5.2 Partial Element Equivalent (PEEC) Circuits

Electromagnetic fields and time delays in VLSI interconnects may distort and delay circuit signals. In high density packages with high frequency clocks, two-dimensional transverse electromagnetic wave (TEM) models are not sufficient to characterize this behavior and it is necessary to work with full wave, three-dimensional models.

PEEC models are obtained by appropriate discretizations of boundary integral formulations of Maxwell's equations which describe the electric and the magnetic field at any point in any conductor. The discretization is chosen to enable the generation of equivalent circuit models which are compatible with existing circuit simulators. Approximations to the current, charge, and the potential (voltage) variables are obtained. Charges are assumed to be located on the conductor surfaces. Each conductor is subdivided into cells. Self and partial inductances and capacitances within and between the cells and between the wires are introduced. Time delays which correspond to the free space travel times between nodal points defined by the discretization are included in the model. The continuity equation which connects the charge and the current variables in Maxwell's equations is replaced by some forms of Kirchoff's laws applied to the resulting equivalent circuits.

FIG. 1 is a schematic of a simple, two wire—two cells per wire configuration. For the self inductance specifications, each wire has been divided into two equal size cells. For the self capacitance definitions it is redivided into one full self capacitance cell and two boundary half-size cells. Each mutual capacitance cell is expressed as a capacitor and current source in parallel.

In FIG. 1, the parameters $p_{jj}$, $1 \leq j \leq 6$, denote the self capacitances of the three full or half capacitance cells in each wire. The self inductances of each inductance cells are denoted by the parameters $Lp_{kk}$, $1 \leq k \leq 4$. To complete the PEEC model we must introduce the mutual capacitances and inductances between cells within each wire and between cells in different wires.

$$A_1(s) = \begin{bmatrix} -1 & 1 & 0 & 0 & 0 & 0 & sl_1 & sl_{12}^{\tau L} & sl_{13}^{\tau L} & sl_{14}^{\tau L} \\ sp_1 & 0 & 0 & 0 & 0 & 0 & 1p_{12}^{\tau P} & dp_{12,13}^{\tau P} & dp_{14,15}^{\tau P} & dp_{15,16}^{\tau P} \\ 0 & sp_2 & 0 & 0 & 0 & 0 & -1p_{21}^{\tau P} & 1p_{23}^{\tau P} & dp_{24,25}^{\tau P} & dp_{25,26}^{\tau P} \\ 0 & -1 & 1 & 0 & 0 & 0 & sl_{21}^{\tau L} & sl_2 & sl_{23}^{\tau L} & sl_{24}^{\tau L} \\ 0 & 0 & sp_3 & 0 & 0 & 0 & dp_{31,32}^{\tau P} & -1p_{32}^{\tau P} & dp_{34,35}^{\tau P} & dp_{35,36}^{\tau P} \\ 0 & 0 & 0 & -1 & 1 & 0 & sl_{31}^{\tau L} & sl_{32}^{\tau L} & sl_3 & sl_{34}^{\tau L} \\ 0 & 0 & 0 & sp_4 & 0 & 0 & dp_{41,42}^{\tau P} & dp_{42,43}^{\tau P} & 1p_{45}^{\tau P} & dp_{45,46}^{\tau P} \\ 0 & 0 & 0 & 0 & sp_5 & 0 & dp_{51,52}^{\tau P} & dp_{52,53}^{\tau P} & -1p_{54}^{\tau P} & 1p_{56}^{\tau P} \\ 0 & 0 & 0 & 0 & -1 & 1 & sl_{41}^{\tau L} & sl_{42}^{\tau L} & sl_{43}^{\tau L} & sl_4 \\ 0 & 0 & 0 & 0 & 0 & sp_6 & dp_{61,62}^{\tau P} & dp_{62,63}^{\tau P} & dp_{64,65}^{\tau P} & -1p_{65}^{\tau P} \end{bmatrix} \quad (1)$$

We use $p_{ij}$, $i \neq j$, $1 \leq i,j \leq 6$, to denote the partial (mutual) capacitances between capacitance cells which are in the same or different wires and $Lp_{km}$, $k \neq m$, $1 \leq k,m \leq 4$, to denote mutual inductances between inductance cells which are in the same or different wires. The corresponding system of delay-differential equations, obtained by the usual modified nodal analysis technique, is formulated in terms of the nodal voltages $V_j$, j=1, ..., 6 and the inductance currents $i_{L_k}$, k=1, ..., 4. Therefore, the final PEEC model for FIG. 1 has size n=10 where the unknowns are $[V_1, V_2, V_3, V_4, V_5, V_6, i_{L_1}, i_{L_2}, i_{L_3}, i_{L_4}]^T$.

In this invention we focus on frequency domain formulations of PEEC models. The Laplace transform of the system matrix A(s) for a PEEC model for the circuit in FIG. 1 is given in Equation (1) where we have used the equivalences defined in Table 1. The equations are constructed using a condensed modified nodal analysis approach.

TABLE 1

| Notation used in Equations(1). | |
|---|---|
| Notation | Expanded Equivalent |
| $sp_j$ | s/P(j,j) |
| $sl_j$ | sLp(j,j) |
| $sl_{ij}^{\tau L}$ | $sLp(i, j)e^{-sDL(i,j)}$ |
| $dp_{ij,ij+1}^{\tau P}$ | $(P(i, j)/P(i, i))e^{-sDP(i,j)} - (P(i, j + 1)/P(i, i))e^{-sDP(i,j)}$ |
| $1p_{ij}^{\tau P}$ | $1 - (P(i, j)/P(i, i))e^{-sDP(i,j)}$ |

In Table 1, P, Lp, DP, DL denote respectively, the matrices of capacitance, inductance, capacitance time delay, and inductance time delay. Columns 1–6 in $A_1(s)$ correspond to nodal voltages, and columns 7–10 correspond to inductance currents. We observe that $A_1(s)$ is not sparse. Columns corresponding to inductive currents are full because we have assumed complete coupling of the fields between all of the cells. If all of the time delays are set to zero, then the resulting matrix would have the same nonzero form as $A_1(s)$ with all exponential terms set to 1.

The time delay matrices are constructed by dividing the centroid distances between appropriate cell nodes by the speed of light. For typical PEEC models there are many different time delays and these delays are not negligible or even small. Furthermore, from Equation (1) it is apparent that these delays are associated with both state variables and derivatives of state variables. Therefore PEEC models do not possess any special properties which might simplify the analysis.

5.3 PEEC Models with Zero Time Delays

To provide motivation and to make the discussion self-contained, we first consider models with no time delays. In section 5.4 we extend these ideas to systems with time delays. We can analyze any linear, time invariant system described by ordinary differential equations by analyzing the corresponding frequency domain transfer function. The poles of the transfer function characterize the stability of the system. The zeros of the transfer function provide information about the passivity of the system.

Consider any physical system described by a linear, time invariant first order system of ordinary differential equations, $$C\dot{x}=G\chi+Bu,\ y=E\chi. \quad (2)$$

The matrices C and G are n×n where n is the order of the system. B is n×q where q is the number of input variables, and E is p×n where p is the number of output variables. If q=p=1, then the transfer function H(s) satisfies $$y(s)/u(s)=H(s)=E(sC-G)^{-1}B, \quad (3)$$

and H(s) is a rational functions of s. In general, H(s) is a p×q matrix whose entries are the si/so transfer functions for each possible input and output pair.

A linear system is stable if and only if all of the poles of the system are in the closure of the left-half complex plane. Poles, the natural frequencies of the system, correspond to solutions of equation (2) corresponding to zero system input. If we define A(s)=sC−G, then poles are values of s such that A(s)χ=0 for nontrivial x, $$\det A(s)=0 \text{ or equivalently } G\chi = sC\chi. \quad (4)$$

The zeros correspond to nonzero system inputs u which yield zero system outputs y. They are values of s for which there exist nontrivial χ and u satisfying equation (5).

$$F(s) \equiv \begin{bmatrix} (sC-G) & -B \\ E & 0 \end{bmatrix} \begin{bmatrix} x \\ u \end{bmatrix} = 0.$$

If B and $E^T$ have the same dimensions, p=q, the computation in equation (5) can be expressed as the following generalized eigenvalue problem.

$$\begin{bmatrix} G & B \\ E & 0 \end{bmatrix} \begin{bmatrix} x \\ u \end{bmatrix} = s \begin{bmatrix} C & 0 \\ 0 & 0 \end{bmatrix} \begin{bmatrix} x \\ u \end{bmatrix}$$

Therefore, if p=q, we can compute poles and zeros of systems defined by linear, time invariant ordinary differential equations by solving related linear eigenvalue problems.

We note that for large systems, variants of Lanczos methods can be used to obtain approximations to transfer functions of such systems. A nonsymmetric Lanczos procedure applied to system (3) yields simultaneously approximations to dominant poles and to dominant zeros of the original system. Those approaches do not however extend directly to systems with significant time delays.

5.4 PEEC Models with Time Delays

Consider a physical system described by a time invariant linear system of ordinary differential equations with time delays. The PEEC models considered in this invention have the following time domain formulation.

$$Cx(t) + \sum_{k,m=1}^{M} \tilde{C}_{k,m}\dot{x}(t-\tau_{k,m}^L) =$$

$$Gx(t) + \sum_{i,j=1}^{J} \tilde{G}_{i,j}x(t-\tau_{i,j}^P) + Bu(t) + \sum_{l=1}^{L} \tilde{B}_l u(t-\tau_l^{L,P}),$$

$$y = Ex(t).$$

Each matrix C, $C_{k,m}$ and G, $G_{i,j}$ is n×n where n is the order of the system. Each B, $B_l$ is n×q where q is the number of input variables, and E is p×n where p is the number of output variables. The time delays terms in $B_l(s)$ may involve time delays associated with capacitances or inductances. We note, moreover that the procedure described in section 5.6 is not specific to this particular description. The corresponding transfer function H(s) is defined by equation (8).

$$y(s)/u(s) = H(s) = E(s)(A(s))^{-1}B(s) \text{ where}$$

$$A(s) = sC + \sum_{k,m=1}^{m} C_{k,m}(s) - G - \sum_{i,j=1}^{J} G_{i,j}(s),$$

$$B(s) = \sum_{l=0}^{L} B_l(s), \text{ and } E(s) = E.$$

The poles of this system are the values of s such that $$\det A(s)=0. \quad (9)$$

Equation (9) is, however, no longer a simple linear eigenvalue computation. This equation is nonlinear and transcendental in s. Similarly, if p=q, then zeros of system (7) correspond to nontrivial solutions of the nonlinear transcendental equations (10), $$F(s) \equiv \begin{bmatrix} A(s) & -B(s) \\ E(s) & 0 \end{bmatrix} \begin{bmatrix} x \\ u \end{bmatrix} = 0.$$

Equations (10) do not reduce to a linear generalized eigenvalue problem. Therefore, we must consider alternative mechanisms for analyzing such systems. We present such a mechanism in section 5.6. The development uses ideas from linear pseudospectral analysis.

We note that if A(s) were a polynomial function of s, then we could reduce Equations (9) to a larger linear eigenvalue problem.

5.5 Pseudospectral Analysis of Nonsymmetric Matrices

We review briefly linear pseudospectral analysis. A matrix K is normal if and only if it has a complete set of orthonormal eigenvectors. If a normal matrix K is perturbed by a matrix δ, then the eigenvalues of $\tilde{K}=K+\delta$ can differ from those of K by at most $\|\delta\|_2$. If, however, K is nonnormal, then small perturbations in K may cause large changes in the eigenvalues, in which case eigenvalue computations become imperfect tools for analyzing the behavior of K.

To characterize this type of behavior Trefethen proposed studying the behavior of the $\|(K-sI)^{-1}\|_2$ as s is varied. When K is normal, $$\|(K-sI)^{-1}\|_2 = 1/\text{dist}(s, \omega(K)), \qquad (11)$$

and the distance of s from the spectrum of K controls the size of this norm. If K is nonnormal, then this relationship does not hold. Trefethen has focussed on the computation of pseudospectra $\Phi_\epsilon(K)$ where $$\Phi_\epsilon(K) = \{s \mid \|(K-sI)^{-1}\|_2 > 1/\epsilon\} \text{ for } \epsilon > 0 \text{ and small } \epsilon. \qquad (12)$$

He proposed plotting $\Phi_\epsilon(K)$ sets for many values of $\epsilon > 0$ and using the plots to study the nonnormality of K. His idea was to use the relative sizes and shapes of the $\Phi_\epsilon(K)$ sets as indicators of the influence of different parts of the spectrum of K upon the behavior of various iterative methods when they are applied to K.

Since $\|K-sI\|_2^{-1} = 1/\sigma_n(K-sI)$ where $\sigma_n(K-sI)$ is the smallest singular value of K-sI, pseudospectral computations may be performed by computing appropriate singular values of K-sI. Therefore, we could replace Definition (12) by the sets $$\Lambda_\epsilon = \{s \mid \sigma_n(K-sI) \leq \epsilon\} \text{ for } \epsilon > 0 \text{ and small.} \qquad (13)$$

Singular value computations are numerically stable. For very large problems, a Hermitian or a real symmetric Lanczos procedure can be used to compute approximations to the required singular values of K-sI. We can make the following definitions, $$\tilde{K}_1(s) \equiv (K-sI)^H(K-sI) \text{ and } \tilde{K}_2(s0) \equiv \begin{bmatrix} 0 & (K-sI) \\ (K-sI) & 0 \end{bmatrix}.$$

The eigenvalues of $\tilde{K}_1(s)$ are the squares of the singular values of K-sI, the desired eigenvalues are on the extremes of the spectrum, but for very small $\sigma_n(K-sI)$, squaring may result in complete loss of numerical accuracy. The eigenvalues of $\tilde{K}_2(s)$ are $\pm$ the singular values of K-sI. Therefore, the relative sizes of the singular values do not change under this transformation. However, the smallest singular values of K-sI are the most interior eigenvalues of $\tilde{K}_2(s)$, and thus may be difficult to compute iteratively. A variant of bidiagonalization and the real symmetric Lanczos recursion without reorthogonalization can be used to compute the singular values required for linear pseudospectra computations. For the pole and zero approximations discussed in sections 5.3 and 5.4 we need only to determine that the smallest singular value is smaller than some tolerance.

In the PEEC model application and in other applications involving time delays, we do not obtain linear eigenvalue problems. However, using the observation, that the pole computations, and if p=q, also the zero computations, can be viewed as nonlinear, transcendental eigenvalue computations, we can extend pseudospectral ideas to such problems. This approach leads us to a procedure for obtaining approximations to poles and zeros of such systems within user-specified boxes of interest in the complex plane.

5.6 Procedure for Approximating Poles and Zeros of PEEC Models

We want to be able to incorporate very large PEEC models into VLSI interconnect circuit simulations. We will do this by constructing reduced order models for the interconnect portions of the circuits, and then connecting these models together with reduced order models for other portions of the circuits.

It is well-known that when coupled, models which are stable individually, may yield a model which is not stable. It is also known, however, that if the individual models are not only stable but also passive, then the coupled model will be stable. Therefore, we would like to be able to create PEEC models which are both stable and passive within the frequency ranges of interest. In this section we describe a tool which can be used to study stability and passivity properties of various PEEC models. This procedure, however, is not specific to this application and can be used on other problems described by linear systems of time-invariant, ordinary delay-differential equations with transfer functions expressed as in equation (8).

We make the following definitions. Let W(s) be any m×m matrix function of s. Define $$\Phi_\epsilon^{nl}(W(s)) = \{s \mid \kappa_2(W(s)) \equiv \|W(s)\|_2 \|(W(s))^{-1}\|_2 > 1/\epsilon\} \text{ for } \epsilon > 0 \text{ and small.} \qquad (15)$$

Any s with detW(s)=0 is included in each $\Phi_\epsilon^{nl}(W(s))$. Such an s is an eigenvalue of the associated nonlinear eigenvalue problem, determine a value of s and a nontrivial vector z such that W(s)z=0.

In practice, we will not try to directly compute or identify the subsets, $\Phi_\epsilon^{nl}(W(s))$. The pole and the zero computations can also be viewed as determining points s at which the rank of a matrix W(s) changes. Therefore, in practice, we are interested in determining regions in the complex plane where the specified matrices incur changes in rank. In fact, since the F(s) in Equation (10) corresponding to zero computations need not be square, the zero computations cannot always be viewed as nonlinear eigenvalue problems, and it is necessary to work within the more general framework of singular value computations.

We can track changes in rank by tracking singular values of the A(s) or F(s) matrices. The procedure assumes that these matrices are rank deficient only at values of s which correspond to the desired poles or zeros. We require the B(s) and the E(s) matrices to have full rank for all s considered.

We have the following nonlinear pseudospectral procedure. $L_{max}$ denotes the base 10 logarithm of the largest computable number on the computer being used.

Pseudospectral Poles/Zeros Procedure

1. Specify a region $\Omega$ in the complex s-plane which includes all frequencies s of interest in the application.
2. Construct a two-dimensional grid $(\chi_i, y_j)$, $1 \leq i \leq I$, $1 \leq j \leq J$ on $\Omega$, and define $S_{i,j} = \chi_i + \sqrt{-1} y_j$.
3. Set W(s)=A(s) defined by equation (8), if poles are desired. Set W(s)=F(s) defined by equation (10), if zeros are desired.
4. Do the following for $1 \leq i \leq I$, $1 \leq j \leq J$:
   (a) Compute the largest and the smallest nontrivial singular values. $\sigma_1$ and $\sigma_{eff}$ of $W(s_{i,j})$.
   (b) Define $\text{Cond}_{W(s_{i,j})} = \log_{10}(\sigma_1/\sigma_{eff})$, if $\sigma_{eff} \neq 0$. Label $s_{i,j}$ as a pole (zero) of the system and set $\text{Cond}_{W(s_{i,j})} = L_{max}$, if $\sigma_{eff} = 0$,
5. Construct two or three dimensional color plots of the values of $\text{Cond}_{W(s_{i,j})}$ in $\Omega$.
6. Examine the plots and using the changes in color, identify areas in the plot corresponding to significant and large changes in the values of $\text{Cond}_{W(s_{i,j})}$. Label such regions as regions containing poles of the original system if W(s)=A(s), or as regions containing zeros if W(s)=F(s).

If W(s) is m×k, then $\sigma_{eff}$ denotes $\sigma_{min(m,k)}$, the smallest singular value of W(s). This procedure tracks the effective condition number of W(s) in the user-specified region $\Omega$ as we vary s in the region.

For mesh points $s_{i,j}$ which surround a pole or zero, the values of $\text{Cond}_{W(s_{i,j})}$ will systematically increase as these mesh points get closer to that pole or zero. Since we are only identifying areas of sensitivity, and not specific values for a pole or zero, it is not necessary for the mesh to be very fine. However, users should run the procedure using at least two mesh sizes to check that they have identified all pole and zero areas in the specified region. To control the scaling in the plots, we use base 10 logarithms of $\sigma_1/\sigma_{\mathit{eff}}$.

In two-dimensional plots over $\Omega$, the changes in color correspond to the changes in amplitude of $\text{Cond}_{W(s_{i,j})}$ and are used to identify regions of interest. In three-dimensional plots $\text{Cond}_{W(s_{i,j})}$ is available directly and through the coloring, and both can be used to identify areas containing poles or zeros of the underlying system.

5.7 Important Observations

This procedure does not require or make any approximations to the original pole matrix, A(s), or zero matrix, F(s). All approximations are confined to the choice of the grid used in the pseudospectral computations. Typically, a relatively crude mesh identifies interesting regions in the complex plane where, if desired, the user can rerun the procedure, using a finer mesh restricted to that region, to achieve better locality of the poles or zeros in that region. By making the grid finer in smaller regions of interest, we can obtain increasingly more accurate approximations to the desired poles or zeros of PEEC systems. Those types of computations were used in our development of reduced order modeling algorithms.

This procedure makes no restrictions on the sizes of the time delays within the original system in equation (8). It also makes no restrictions upon the types of time delays. Delays may correspond to state variables or derivatives of state variables.

This procedure can be used to study poles and zeros of other systems which can be modeled by linear time invariant systems of ordinary differential equations with or without time delays.

We note also that this procedure can be used to track changes in the locations of the poles and zeros of models which contain various parameters, as we vary those parameters. Plots obtained using various values of a parameter can be compared to determine the sensitivity of the given model or system to different choices of these parameters, and to determine the effect of that parameter on the stability or passivity of the model or system. These types of analyses are very important in understanding the behavior of PEEC models.

In the next section we apply this procedure to the PEEC example described in section 5.2, and to a larger version of that type of example.

5.8 Numerical Tests: PEEC Models

We consider two PEEC models. Example 1 corresponds to Equations (1) with the parameter matrices defined in Equations (16, 17). Example 2 is a larger PEEC model for three wires with 20 cells per wire.

$$P_1 = \begin{bmatrix} 5.344 & 1.459 & 0.605 & 0.361 & 0.279 & 0.225 \\ 1.458 & 3.672 & 1.458 & 0.528 & 0.368 & 0.279 \\ 0.605 & 1.459 & 5.344 & 0.918 & 0.529 & 0.361 \\ 0.361 & 0.528 & 0.918 & 5.344 & 1.459 & 0.605 \\ 0.279 & 0.368 & 0.528 & 1.459 & 3.672 & 1.459 \\ 0.225 & 0.279 & 0.361 & 0.605 & 1.459 & 5.344 \end{bmatrix} \quad (16)$$

-continued $$Lp_1 = \begin{bmatrix} .0041 & .0012 & .0004 & .0003 \\ .0012 & .0041 & .0007 & .0004 \\ .0004 & .0007 & .0041 & .0012 \\ .0003 & .0004 & .0012 & .0041 \end{bmatrix}$$

$$DP_1 = \begin{bmatrix} .0 & .033 & .067 & .083 & .117 & .150 \\ .033 & .0 & .033 & .050 & .083 & .117 \\ .067 & .033 & .0 & .017 & .050 & .083 \\ .083 & .050 & .017 & .0 & .033 & .067 \\ .117 & .083 & .050 & .033 & .0 & .033 \\ .150 & .117 & .083 & .067 & .033 & .0 \end{bmatrix} \quad (17)$$

$$DL_1 = \begin{bmatrix} .0 & .033 & .083 & .117 \\ .033 & .0 & .050 & .083 \\ .083 & .050 & .0 & .033 \\ .117 & .083 & .033 & .0 \end{bmatrix}$$

Since PEEC models correspond to physical systems, there exist physical limits on the system response times. Therefore, we can restrict our considerations to well-chosen boxes in the complex plane. Of particular interest are regions near the imaginary axis, since if we set all the time delays to zero, the poles and the zeros of the resulting systems will lie on the imaginary axis.

We also know a priori that s=0 is a pole of the system. Therefore, we select grid points to avoid s=0. Furthermore, we know from other considerations that any poles or zeros must occur in conjugate pairs so that we need only consider the behavior in a region in the upper half of the complex plane. For the tests described here we selected the box [−20, 10]×[−5, 100] in the complex plane. All computations were done using MATLAB. The resulting computations are depicted in FIGS. 2–7.

Unfortunately, in this description we are confined to black and white pictures which do not adequately depict the strength of this procedure. FIGS. 2–7 were obtained from color plots constructed using MATLAB with the black and white MATLAB deps print command. Therefore, the color bar scaling is not monotone. In each case, in color, it is easy to discern the pole and zero locations. In black and white, however, the color distinctions are muted to the point that identifications can become difficult.

We consider pole computations first. The poles of a system are independent of the choice of the input and output matrices. For Example 1, we use A(s) defined in equation (8). The results of applying Procedure 5.6 to Example 1 using A(s) are depicted in FIG. 2. Even using the gray scale, we can determine that this system is stable for the frequencies considered in the computations.

For Example 2 we used a larger version of A(s) generated automatically using a modified circuit simulation code. The results of applying Procedure 5.6 to A(s) for Example 2 are depicted in FIG. 3. Using the gray scale this system appears to be unstable for the frequencies considered in the computations. To verify the instability, we reran Procedure 5.6 using only the region [−0.5, 0.5]×[44.5, 46.5]. The results of these computations are depicted in FIGS. 4, 5. FIG. 4 clearly illustrates that indeed there is a pole in the right-half plane. FIG. 5, which is a rotated image of a three-dimensional plot, pinpoints the troublesome frequency.

Using Example 1, we consider two examples of zero computations. These are both for si/so systems. However, the procedure as currently programmed handles arbitrary mi/mo with p=q. The zeros of a system, see Equation (10) depend not only upon A(s) but also upon the choice of the input matrix B(s) and the output matrix E(s). In both cases, B(s) is defined by Equation (18). This input corresponds to a unit current source at node 1 in FIG. 1 with all time delays in B(s) set equal to zero. Case 1 corresponds to $E_1$ in Equation (18), selecting the second nodal voltage $V_2$ as the output. See FIG. 6. Case 2 corresponds to $E_2$ in Equation (18), selecting the first inductance current $I_{L_1}$ as the output. See FIG. 7.

$$B(s)=(0, 1, 0.397, 0, 0.113, 0, 0.067, 0.075, 0, 0.042) \ E_1=(0, 1, 0, 0, 0, ,0, 0, 0, 0, 0) \ E_2=(0, 0, 0, 0, 0, 0, 1, 0, 0, 0) \quad (18)$$

If a system is passive, all of the zeros must lie in the left half plane. We observe that the zeros for both of these systems satisfy that condition.

FIG. 8 shows steps of a preferred method according to the present invention. In step S100, a physical system having time delays is represented as a linear circuit model. In step S102, the linear circuit model is transformed into a corresponding transform domain circuit. Sensitivity analysis is applied in step S104 to generate information indicative of stability or passivity of the physical system. In step S106, a graphical representation of the information is created.

5.9 Summary

We have presented a computational procedure for studying the stability and the passivity of PEEC models in specified regions of the complex plane. These examples clearly illustrate the capabilities of this tool. This tool is not specific to PEEC applications, and can be used for studying the stability and passivity of other systems which can be modeled using linear, time-invariant systems of ordinary differential equations with or without time delays. This procedure uses the actual system, no approximations to the system are required. All approximations are confined to the grid constructions used in the computations.

What is claimed:

1. A method for analyzing stability and passivity of a physical system comprising time delays, the method comprising:
   (a) representing said physical system comprising said time delays as a partial element equivalent circuit (PEEC) model;
   (b) transforming the PEEC model into a corresponding transform domain circuit model;
   (c) applying sensitivity analysis to the transform domain circuit model for generating information indicative of the stability or the passivity of the physical system comprising said time delays; and
   (d) creating a graphical representation of the information indicative of the stability or the passivity of the physical system.

2. A method according to claim 1, wherein step (a) comprises representing the physical system comprising said time delays as a lumped circuit model.

3. A method according to claim 1, wherein step (a) comprises representing the physical system comprising said time delays so that it comprises lumped and distributed subcomponents.

4. A method according to claim 1, wherein step (b) comprises transforming the linear circuit model into a corresponding frequency domain circuit model.

5. A method according to claim 4, wherein the corresponding frequency domain circuit model comprises a Laplace transform of the physical system.

6. A method according to claim 5, wherein the sensitivity analysis is applied to the Laplace transform of the physical system comprising said time delays.

7. A method according to claim 6, wherein the sensitivity analysis comprises superimposing a two dimensional grid on a preselected portion of the Laplace transform.

8. A method according to claim 7, wherein the sensitivity analysis comprises sweeping through the two dimensional grid for estimating a sensitivity of the Laplace transform.

9. A method according to claim 8, wherein creating said graphical representation comprises scaling the estimated sensitivity for creating graphical input parameters representative of the stability of said physical system comprising said time delays.

10. A method according to claim 9, wherein creating said graphical representation further comprises using the graphical input parameters for two dimensional color graphical representation indicative of the stability of the physical system comprising said time delays.

11. The method of claim 1, wherein the time delays correspond to free space travel times between nodal points of said linear circuit model.

12. The method of claim 1, wherein the linear circuit model comprises a partial element equivalent circuit.

13. A method for analyzing stability of a partial element equivalent circuit (PEEC) model, the method comprising:
   (a) representing a physical system comprising time delays as said PEEC model, said time delays corresponding to free space travel times between nodal points;
   (b) transforming the PEEC model into a transform domain circuit model;
   (c) applying sensitivity analysis to the transform domain circuit model for generating information indicative of the stability of the physical system comprising said time delays; and
   (d) graphically representing the information indicative of the stability of the physical system comprising said time delays.

14. A method according to claim 13, wherein transforming said PEEC model comprises transforming the linear circuit model into a frequency domain circuit model.

15. A method according to claim 14, wherein the frequency domain circuit model comprises a Laplace transform of the physical system comprising said time delays.

16. A method according to claim 15, wherein the sensitivity analysis is applied to the Laplace transform of the physical system comprising said time delays.

17. A method according to claim 16, wherein the sensitivity analysis comprises superimposing a two dimensional grid on a preselected portion of the Laplace transform.

18. A method according to claim 17, wherein the sensitivity analysis comprises sweeping through the two dimensional grid for estimating a sensitivity of the Laplace transform.

19. A method according to claim 18, wherein creating said graphical representation comprises scaling the estimated sensitivity for creating graphical input parameters representative of the stability of the physical system comprising said time delays.

20. A method according to claim 19, wherein creating said graphical representation further comprises using the graphical input parameters for two dimensional color graphical representation indicative of the stability of the physical system comprising said time delays.

* * * * *